United States Patent
Chen et al.

(10) Patent No.: US 11,910,563 B2
(45) Date of Patent: Feb. 20, 2024

(54) LIQUID COOLING MODULE WITH MOVABLE RADIATORS

(71) Applicant: Quanta Computer Inc., Taoyuan (TW)

(72) Inventors: Jen-Mao Chen, Taoyuan (TW); Wei-En Tsai, Taoyuan (TW); Sin-Hong Lien, Taoyuan (TW); Jhih-Bin Guan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 332 days.

(21) Appl. No.: 17/353,301

(22) Filed: Jun. 21, 2021

(65) Prior Publication Data

US 2022/0408593 A1 Dec. 22, 2022

(51) Int. Cl.
*H05K 7/20* (2006.01)

(52) U.S. Cl.
CPC ..... *H05K 7/20263* (2013.01); *H05K 7/20254* (2013.01); *H05K 7/20272* (2013.01); *H05K 7/20772* (2013.01)

(58) Field of Classification Search
CPC ........... H05K 7/20263; H05K 7/20254; H05K 7/20272; H05K 7/20772; H05K 7/20727; H01L 23/473
See application file for complete search history.

(56) References Cited

U.S. PATENT DOCUMENTS

| | | | |
|---|---|---|---|
| 8,564,951 B1* | 10/2013 | Watanabe | G06F 1/20 165/185 |
| 2004/0008483 A1* | 1/2004 | Cheon | G06F 1/20 361/699 |
| 2005/0088820 A1* | 4/2005 | Naganawa | F28D 1/05341 257/E23.098 |
| 2014/0071616 A1* | 3/2014 | Watanabe | H05K 7/20772 361/679.47 |
| 2015/0282389 A1* | 10/2015 | Iyengar | H05K 7/20809 361/679.47 |
| 2017/0127576 A1* | 5/2017 | Campbell | H05K 7/20318 |
| 2017/0325357 A1* | 11/2017 | Tsai | H01L 23/467 |
| 2018/0172365 A1* | 6/2018 | Tsai | H01L 23/34 |
| 2020/0221604 A1* | 7/2020 | Chen | H05K 7/20327 |
| 2023/0092139 A1* | 3/2023 | Zhang | G05B 15/02 700/282 |

* cited by examiner

Primary Examiner — Michael A Matey
(74) Attorney, Agent, or Firm — NIXON PEABODY LLP

(57) ABSTRACT

A computing device comprises a housing, a heat-generating electronic component, at least one additional electronic component, and a liquid cooling module. The heat-generating component, the at least one additional electronic component, and the liquid cooling module are all positioned inside the housing. The liquid cooling module is configured to cool the heat-generating electronic component, and includes at least one movable radiator. The at least one movable radiator is configured to move between a first position and a second position. When the at least one movable radiator is in the first position, the at least one movable radiator blocks access to the at least one additional electronic component within the housing. When the at least one movable radiator is in the second position, the at least one movable radiator allows access to the at least one additional electronic component within the housing.

18 Claims, 6 Drawing Sheets

LIQUID COOLING MODULE WITH MOVABLE RADIATORS

TECHNICAL FIELD

The present disclosure relates generally to a liquid cooling module. More particularly, aspects of this disclosure relate to a liquid cooling module with movable radiators to selectively allow and block access to electronic components within a computing device.

BACKGROUND

Computing devices (such as servers) typically contain one or more heat-generating electronic components, such as a central processing unit (CPU), a graphics processing unit (GPU), and others. To aid in cooling these heat-generating electronic components, liquid cooling modules can be used. Liquid cooling modules utilize cooling liquid to transfer heat away from the heat-generating components. However, due to the size and arrangement of electronic components within the housing of the computing device, liquid cooling modules are often limited in their own size and arrangement, which can reduce the effectiveness of the cooling provided by the liquid cooling modules.

Thus, there is a need for improved liquid cooling modules that can more effectively remove heat from heat-generating electronic components within computing devices.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

The various examples of the present disclosure are directed towards a liquid cooling module for cooling an electronic component. In a first embodiment of the present disclosure, a liquid cooling module comprises a fluid tank, at least one movable radiator, and one or more cooling tubes. The fluid tank is configured to hold cooling fluid therein. The at least one movable radiator is configured to move between a first position relative to the fluid tank and a second position relative to the fluid tank. The one or more cooling tubes are fluidly coupled to the fluid tank and the at least one movable radiator, to allow the cooling fluid to flow between the fluid tank and the at least one movable radiator. When the at least one movable radiator is in the first position relative to the fluid tank, the at least one movable radiator extends from the fluid tank in a first direction. When the at least one movable radiator is in the second position relative to the fluid tank, the at least one movable radiator extends from the fluid tank in a second direction. The second direction is different than the first direction.

In some examples of the first embodiment, the at least one movable radiator is rotatably coupled to the fluid tank, such that the at least one movable radiator is configured to rotate between the first position and the second position.

In some examples of the first embodiment, the at least one movable radiator is rotatably coupled to the fluid tank via a hinge.

In some examples of the first embodiment, when the at least one movable radiator is in the first position, at least one of the one or more cooling tubes extends a first distance between the at least one movable radiator and the fluid tank, and when the at least one movable radiator is in the second position, the at least one of the one or more cooling tubes extends a second distance between the at least one movable radiator and the fluid tank, the second distance being less than the first distance.

In some examples of the first embodiment, the first direction and the second direction are perpendicular to each other.

In some examples of the first embodiment, when the at least one movable radiator is in the first position, at least one of the one or more cooling tubes extends in the first direction between the at least one movable radiator and the fluid tank, and when the at least one movable radiator is in the second position, the at least one of the one or more cooling tubes extends in the first direction and the second direction between the at least one movable radiator and the fluid tank.

In some examples of the first embodiment, the at least one movable radiator includes a first movable radiator and a second movable radiator.

In some examples of the first embodiment, when the first movable radiator and the second movable radiator are in the first position, the first movable radiator extends in the first direction and the second movable radiator extends in a third direction, the third direction being parallel to and opposite of the first direction.

In some examples of the first embodiment, when the first movable radiator and the second movable radiator are in the second position, the first movable radiator and the second movable radiator extend in the second direction, the second direction being perpendicular to both the first direction and the third direction.

In some examples of the first embodiment, the one or more cooling tubes includes a first cooling tube and a second cooling tube. The first cooling tube is fluidly coupled to the fluid tank and the first movable radiator. The second cooling tube is fluidly coupled to the fluid tank and the second movable radiator In some examples of the first embodiment, the at least one movable radiator includes a plurality of fins formed on an exterior thereof. The plurality of fins defines at least one airflow channel.

In some examples of the first embodiment, the liquid cooling module further comprises a stationary radiator and a cold plate assembly. The stationary radiator is coupled to the fluid tank. The cold plate assembly is coupled to the stationary radiator, and is assembly configured to contact a heat-generating electronic component.

In some examples of the first embodiment, the cold plate assembly includes a first cold plate and a fluid pump. The cold plate is configured to contact the heat-generating component.

In some examples of the first embodiment, the first cold plate is configured to contact the heat-generating electronic component, and the second cold plate is configured to contact the stationary radiator.

In some examples of the first embodiment, the fluid pump is in fluid communication with the stationary radiator, and the stationary radiator is in fluid communication with the fluid tank.

In some examples of the first embodiment, the fluid pump, the stationary radiator, the fluid tank, and the at least one movable radiator form a fluid loop. The fluid pump is configured to cause fluid to flow around the fluid loop.

In some examples of the first embodiment, cooling fluid near the fluid pump is configured to be heated by the heat-generating electronic component. The fluid pump is configured to cause the heated cooling fluid to flow from the cold plate assembly and through the stationary radiator and the at least one movable radiator.

In some examples of the first embodiment, the heated cooling fluid is configured to cool when flowing through the stationary radiator and the at least one movable radiator. The fluid pump is configured to cause the cooled cooling fluid to flow from the stationary radiator and the at least one movable radiator to the cold plate assembly.

In some examples of the first embodiment, the liquid cooling module is combined with a computing device. The computing device includes a housing, a heat-generating electronic component, and at least one additional electronic component. The heat-generating electronic component and the at least one additional electronic component are positioned inside the housing. The liquid cooling module is configured to be positioned inside the housing such that the cold plate assembly contacts the heat-generating electronic component.

In some examples of the first embodiment, when the at least one movable radiator is in the first position, the at least one movable radiator blocks access to the at least one additional electronic component within the housing, and when the at least one movable radiator is in the second position, the at least one movable radiator allows access to the at least one additional electronic component within the housing.

In a second embodiment of the present disclosure, a computing device comprises a housing, a heat-generating electronic component, at least one additional electronic component, and a liquid cooling module. The heat-generating component, the at least one additional electronic component, and the liquid cooling module are all positioned inside the housing. The liquid cooling module is configured to cool the heat-generating electronic component. The liquid cooling module includes a fluid tank, at least one movable radiator, and one or more cooling tubes. The fluid tank is configured to hold cooling fluid therein. The at least one movable radiator is coupled to the fluid tank, and is configured to move between a first position relative to the fluid tank and a second position relative to the fluid tank. The one or more cooling tubes are coupled to the fluid tank and the at least one movable radiator to allow the cooling fluid to flow between the fluid tank and the at least one movable radiator. When the at least one movable radiator is in the first position relative to the fluid tank, the at least one movable radiator blocks access to the at least one additional electronic component within the housing. When the at least one movable radiator is in the second position relative to the fluid tank, the at least one movable radiator allows access to the at least one additional electronic component within the housing.

The above summary is not intended to represent each embodiment or every aspect of the present disclosure.

Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
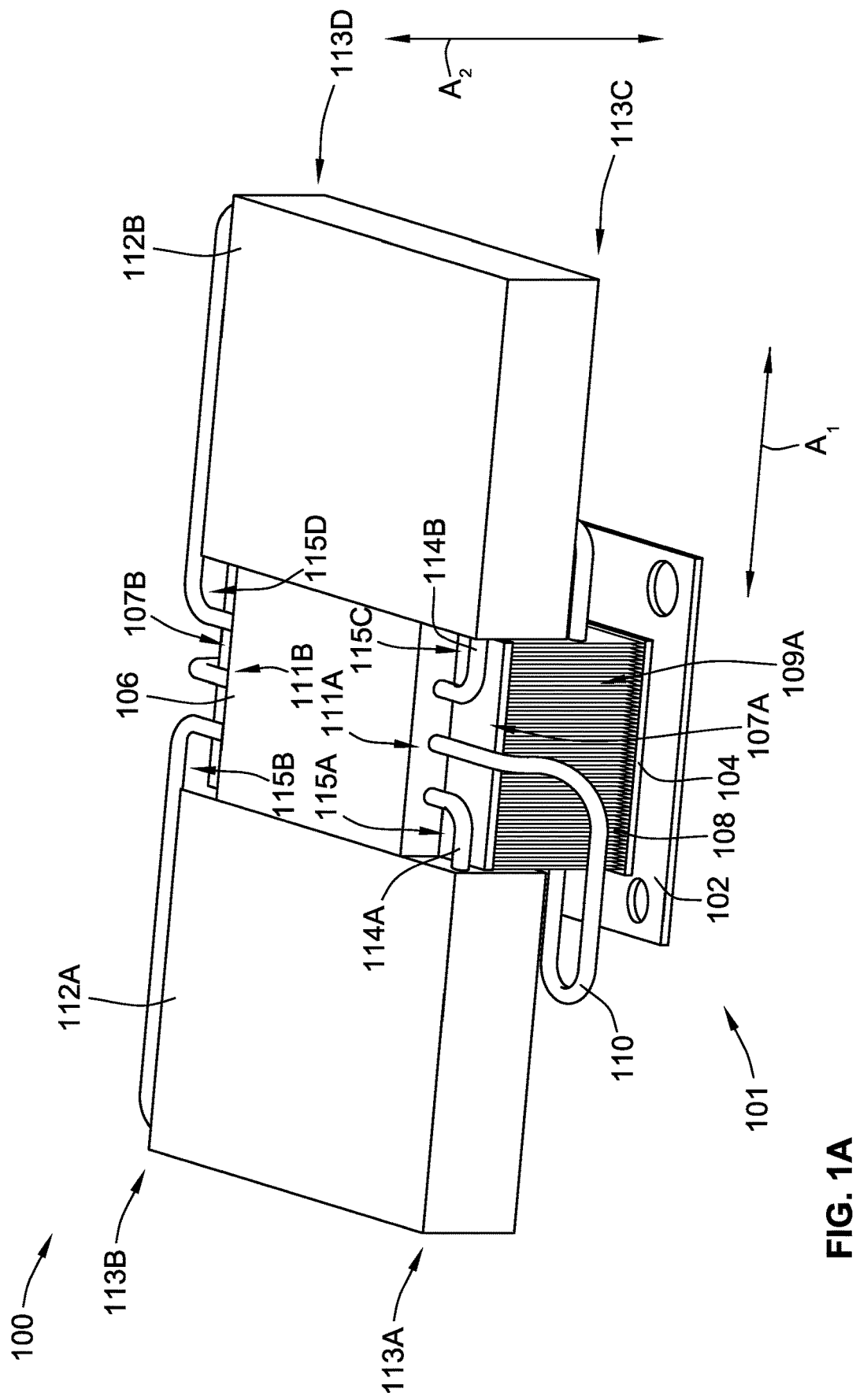
FIG. 1A is a perspective view of a liquid cooling module with movable radiators in a first position, according to aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1A is a perspective view of a liquid cooling module 100 that can be used to cool heat-generating electronic components within a computing device, such as a server. Generally, the computing device will include one or more heat-generating electronic components, such as a central processing unit (CPU), a graphics processing unit (GPU), a dual in-line memory module (DIMM), a network card, a hard disk drive (HDD), a solid state drive (SSD), or a field programmable gate array (FPGA). The liquid cooling module 100 can be placed on top of one of the heat-generating electronic components to aid in cooling the heat-generating electronic component.

The liquid cooling module 100 includes a cold plate assembly 101, a stationary radiator 108, a fluid tank 106, and two movable radiators 112A and 112B. When the liquid cooling module 100 is installed in a computing device, the liquid cooling module 100 is placed on top of the heat-generating electronic component. The cold plate assembly 101 contacts the heat-generating electronic component, when the liquid cooling module 100 is installed. The heat generated by the heat-generating electronic component is transferred to the cold plate assembly 101. Cooling fluid can then be circulated through the liquid cooling module 100 to remove the transferred heat from the liquid cooling module 100. A variety of different types of cooling fluids can be used with the liquid cooling module 100. Non-limiting examples of cooling fluids include fluorocarbons, water (e.g., deionized water), mixtures including water, and hydrocarbons. In some implementations, the cooling fluid is thermally conductive and electrically insulating (e.g., dielectric). In some implementations, the cooling fluid is selected so as to change between its liquid and vapor phases easily and at a desired temperature.

In the illustrated implementation, the cold plate assembly 101 includes a cold plate 102 and a fluid pump 104. When the liquid cooling module 100 is installed, the cold plate 102 contacts the heat-generating electronic component. The fluid pump 104 is positioned between the cold plate 102 and the stationary radiator 108. In other implementations, the fluid pump 104 is positioned internally within the cold plate 102. In still other implementations, the cold plate assembly 101 includes an additional cold plate, and the fluid pump 104 is positioned between the cold plate 102 and the additional cold plate, such that the fluid pump 104 is open to the exterior of the liquid cooling module 100.

The stationary radiator 108 is positioned on top of the fluid pump 104, and is in contact with the fluid pump 104. In some implementations, the stationary radiator 108 is additionally in contact with the cold plate 102. The stationary radiator 108 includes a cooling tube 110 that extends through the interior of the stationary radiator 108. The cooling tube 110 is configured to allow cooling fluid to flow through the stationary radiator 108. In the illustrated implemented, the cooling tube 110 has a continually looping shape, and repeatedly enters and exits the stationary radiator 108. The looping configuration of the cooling tube 110 increases the distance that the cooling tube 110 extends within the stationary radiator 108. However, in other implementations, the cooling tube 110 can have different shapes. For example, the cooling tube 110 could only enter and exit the stationary radiator 108 once, but still have the same continually looping shape within the stationary radiator 108. In another example, the cooling tube 110 could extend through the stationary radiator 108 in a generally straight line. The fluid pump 104 is in fluid communication with the cooling tube 110, and can be operated to cause the cooling fluid to flow through the cooling tube 110.

The fluid tank 106 is positioned on top of the stationary radiator 108, and is in contact with the stationary radiator 108. The fluid tank 106 has a generally hollow interior that can contain the cooling fluid. A first end 111A of the cooling tube 110 is fluidly coupled between a first end 109A of the stationary radiator 108, and a first end 107A of the fluid tank 106. Similarly, a second 111B of the cooling tube 110 is fluidly coupled between a second end (not shown) of the stationary radiator 108, and a second end 107B of the fluid tank 106. The hollow interior of the fluid tank 106 is thus in fluid communication the cooling tube 110, such that the fluid pump 104 can pump cooling fluid between the stationary radiator 108 and the fluid tank 106 via the cooling tube 110.

The movable radiators 112A and 112B are movably coupled to the fluid tank 106. In some implementations, the movable radiators 112A and 112B are rotatably coupled to the fluid tank 106, such that the movable radiators 112A and 112B can rotate relative to the fluid tank 106. In other implementations, the movable radiators 112A and 112B are slidably coupled to the fluid tank 106, such that the movable radiators 112A and 112B can slide relative to the fluid tank 106. In still other implementations, the movable radiators 112A and 112B can be coupled to the fluid tank 106 in other ways, to allow the movable radiators 112A and 112B to move in different ways relative to the fluid tank 106.

The movable radiators 112A and 112B each have a cooling tube extending therein and fluidly coupled to the fluid tank 106. Cooling tube 114A extends within movable radiator 112A, and cooling tube 114B extends within movable radiator 112B. In the illustrated implementation, the cooling tubes 114A and 114B do not repeatedly enter and exit the movable radiators 112A and 112B. However, the cooling tubes 114A and 114B can still have the same continually looping shape within the movable radiators 112A and 112B that the cooling tube 110 does within the stationary radiator 108.

The continually looping shape of the cooling tube 114A extends the distance that the cooing tube 114A extends within the movable radiator 112A. Similarly, the continually looping shape of the cooling tube 114B extends the distance that the cooing tube 114B extends within the movable radiator 112B. In other implementations, the cooling tubes 114A and 114B can have different shapes. For example, the cooling tubes 114A and 114B could repeatedly enter and exit the movable radiators 112A and 112B, similar to the cooling tube 110. In another example, the cooling tubes 114A and 114B can extend through the movable radiators 112A and 112B in generally straight lines.

The cooling tubes 114A and 114B thus fluidly couple the movable radiators 112A and 112B, respectively, to the fluid tank 106, such that cooling fluid can flow between the fluid tank 106 and the movable radiators 112A and 112B. A first end 115A of the cooling tube 114A is fluidly coupled between the first end 107A of the fluid tank 106, and a first end 113A of the movable radiator 112A. A second end 115B of the cooling tube 114A is fluidly coupled between the second end 107B of the fluid tank 106, and a second end 113B of the movable radiator 112A. A first end 115C of the cooling tube 114B is fluidly coupled between the first end 107A of the fluid tank 106, and a first end 113C of the movable radiator 112B. A second end 115D of the cooling tube 114B is fluidly coupled between the second end 107B of the fluid tank 106, and a second end 113D of the movable radiator 112B. The cooling tubes 114A and 114B can be formed from a flexible and/or stretchable material, such that the cooling tubes 114A and 114B can accommodate a variety of different physical positions that the movable radiators 112A and 112B may be in, relative to the fluid tank 106.

The fluid pump 104, the stationary radiator 108, the fluid tank 106, and the movable radiators 112A, 112B form a cooling loop through which the cooling fluid can flow. During operation of the computing device, heat is transferred from the heat-generating electronic component to the cold plate 102 of the cold plate assembly 101. The heat transferred to the cold plate 102 heats any cooling fluid that is located at or near the cold plate assembly 101 (e.g., any cooling fluid in the fluid pump 104 or in the cooling tube 110). The fluid pump 104 then pumps the heated cooling fluid to the stationary radiator 108, and to the movable radiators 112A and 112B (through the fluid tank 106). In some implementations, a portion of the cooling tube 110 may be positioned within the cold plate 102 or in contact with the cold plate 102, in order to aid in transferring heat from the cold plate 102 to the cooling fluid within the cooling tube 110.

The computing device may include one or more fans that cause air to flow past the stationary radiator 108 and the movable radiators 112A and 112B, when the fans are operated. When the air flows past the radiators 108, 112A, and 112B, the air removes the heat from the cooling fluid and the radiators 108, 112A, and 112B. The stationary radiator 108 and the movable radiators 112A and 112B may include one or more fins formed on their exteriors. These fins define airflow channels through which the air from the fans flows. The airflow channels increase the surface area of the radiators 108, 112A, and 112B that the air flows past, which in turn increases the amount of heat that the air removes from the cooling fluid and the radiators 108, 112A, and 112B. The now-cooled cooling fluid is then returned to the fluid tank 106, wherein the cooling fluid can again be heated by the cold plate 102 and/or the heat-generating electronic component.

In some implementations, the components of the liquid cooling module 100 form a complete loop through which the cooling fluid flows. The cold plate 102 will transfer heat from the heat-generating electronic component into the cooling fluid that is flowing through the cooling tube 110 within the stationary radiator 108. As the cooling fluid is pumped through the cooling tube 110 by the fluid pump 104, some of the heat is removed via air flowing past the stationary radiator 108. The cooling fluid then enters the fluid tank 106 via either the first end 111A or the second end 111B of the cooling tube 110, and is then pumped into the movable radiators 112A and 112B so that more heat can be removed from the cooling fluid. The cooling fluid can be pumped into the movable radiators 112A and 112B via the first ends 115A and 115C of cooling tubes 114A and 114B, respectively. As the cooling fluid flows through the cooling tubes 114A and 114B, any remaining heat in the cooling fluid is removed. The now-cooled cooling fluid then returns to the fluid tank 106 via the second ends 115B and 115D of the cooling tubes 114A and 114B, respectively. The cooling fluid is then further pumped back to the stationary radiator 108, via either the first end 111A or the second end 111B of the cooling tube 110.

In some implementations, the hollow interior of the fluid tank 106 is formed as two separate compartments that are both fluid-tight. The first compartment of the fluid tank 106 includes the first end 107A of the fluid tank 106. The first compartment is in fluid communication with the first end 111A of the cooling tube 110, the first end 115A of the cooling tube 114A, and the first end 115C of the cooling tube 114B. The second compartment of the fluid tank 106 includes the second end 107B of the fluid tank 106. The second compartment is in fluid communication with the second end 111B of the cooling tube 110, the second end 115B of the cooling tube 114A, and the second end 115D of the cooling tube 114B. The fluid pump 104 can be operated to pump cooling fluid from the stationary radiator 108 and into the first compartment of the fluid tank 106 via the first end 111A of the cooling tube 110, and then into the movable radiators 112 and 112B via the first ends 115A and 115C of the cooling tubes 114A and 114B. The cooling fluid flows through the movable radiators 112A and 112B, and then back into the second compartment of the fluid tank 106 via the second ends 115B and 115D of the cooling tubes 114A and 114B. Finally, the cooling fluid flows back into the stationary radiator 108 via the second end 111B of the cooling tube 110. The cooling fluid can then flow through the stationary radiator 108 and repeat the process. As the cooling fluid flows through the stationary radiator 108, the cooling fluid is heated by the cold plate 102 and/or the heat-generating electronic component. Some of this heat is removed as the heated cooling fluid flows through the stationary radiator 108, via air flowing past the stationary radiator 108. Some or all of the rest of this heat is removed as the cooling fluid flows through the movable radiators 112A and 112B, via air flowing past the movable radiators 112A and 112B.

FIG. 1A shows the liquid cooling module 100, when the movable radiators 112A and 112B in a first position. When the movable radiators 112A and 112B are in the first position, the movable radiators 112A and 112B extend from the fluid tank 106 primarily along a first axis $A_1$. The movable radiator 112A extends in a first direction along the first axis $A_1$, while the movable radiator 112B extends in a second direction along the first axis $A_1$. The first direction along first axis $A_1$ and the second direction along first axis $A_1$ are parallel to each other and opposite from each other. In the illustrated implementation, when in the first position, the movable radiators 112A and 112B extend primarily horizontally away from the fluid tank 106, and thus are generally in the same vertical position as the fluid tank 106.

Figure 1B:
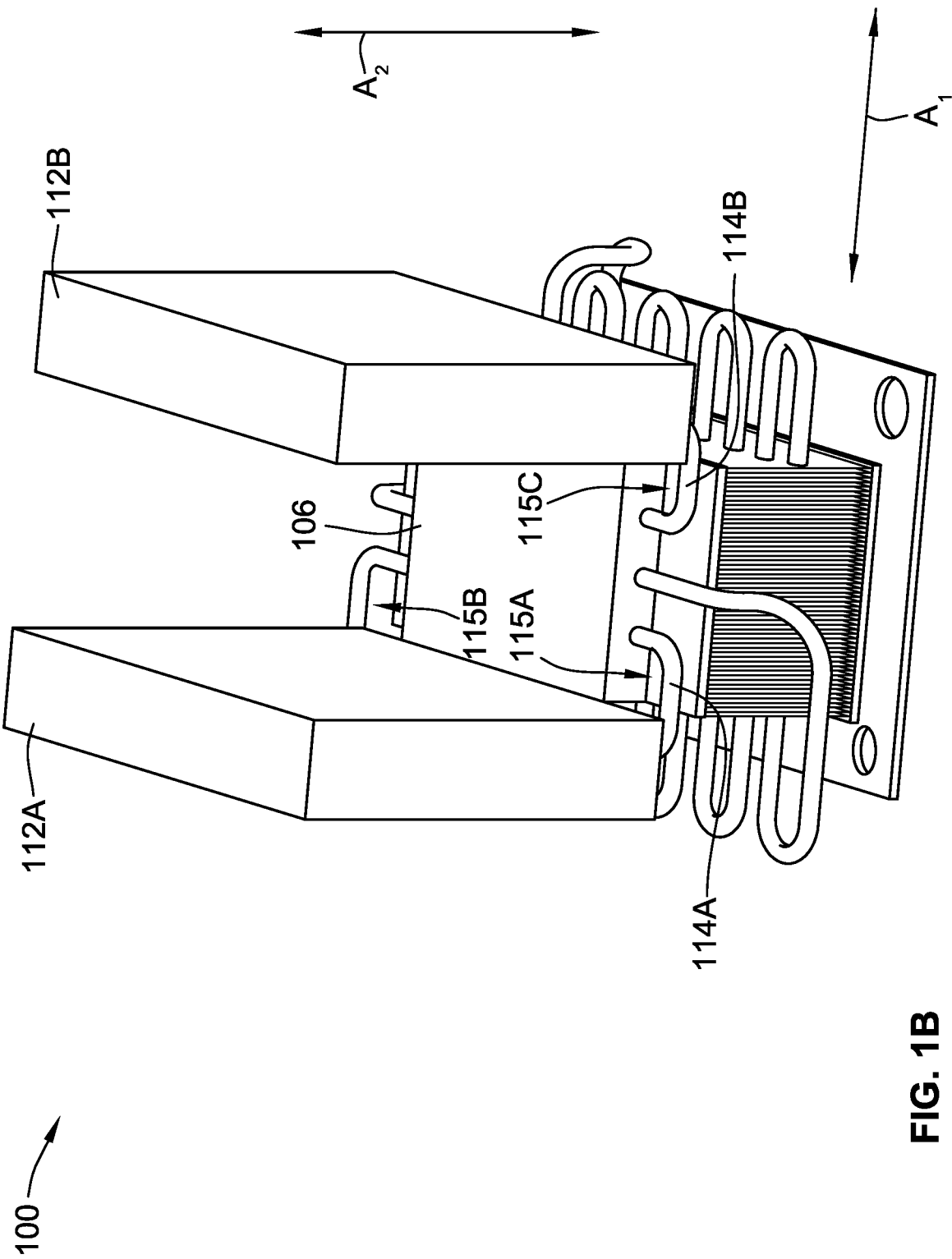
FIG. 1B is a perspective view of the liquid cooling module of FIG. 1A with the movable radiators in a second position, according to aspects of the present disclosure.

FIG. 1B shows the liquid cooling module 100, when the movable radiators 112A and 112B are in a second position. When the movable radiators 112A and 112B are in the second position, the movable radiators 112A and 112B extend primarily from the fluid tank 106 along a second axis $A_2$. The second axis $A_2$ is generally perpendicular to the first axis $A_1$. Both of the movable radiators 112A and 112B extend in a first direction along the second axis $A_2$, when the movable radiators 112A and 112B are in the second position. As shown in FIG. 1B, this direction along the second axis $A_2$ is generally perpendicular to both the first direction along the first axis $A_1$ (movable radiator 112A in FIG. 1A), and the second direction along the first axis $A_1$ (movable radiator 112B in FIG. 1A). In the illustrated implementation, when in the second position, the movable radiators 112A and 112B extend primarily vertically away from the fluid tank 106, and thus are generally directly adjacent to the fluid tank 106 in the horizontal direction.

As can be seen by comparing FIG. 1A and FIG. 1B, the cooling tubes 114A and 114B connecting the fluid tank 106 to the movable radiators 112A and 112B can bend and/or stretch as needed to accommodate the physical position of the movable radiators 112A and 112B. When the movable radiators 112A and 112B are in the first position (FIG. 1A), the first end 115A and the second end 115B of the cooling tube 114A extend in the first direction along the first axis $A_1$ (e.g., generally leftward relative to the plane of FIG. 1A) between the fluid tank 106 and the movable radiator 112A. Similarly, the first end 115C and the second end 115D of the cooling tube 114B extend in the second direction along the first axis $A_1$ (e.g., generally rightward relative to the plane of FIG. 1A) between the fluid tank 106 and the movable radiator 112B. The ends 115A-115D also generally extend along a third axis (not shown) that is perpendicular to both the first axis $A_1$ and the second axis $A_2$ (e.g., in a direction into and out of the plane of FIG. 1A) when the movable radiators 112A and 112B are in the first position.

As shown in FIG. 1B, when the movable radiators 112A and 112B are in the second position, the ends of the cooling tubes 114A and 114B bend to accommodate the second position of the movable radiators 112A and 112B. The first end 115A and the second end 115B of the cooling tube 114A now additionally extend a small amount in the first direction along the second axis $A_2$ (e.g., generally upward relative to the plane of FIG. 1B), to accommodate the movable radiator 112A moving to the second position. Similarly, the first end 115C and the second end 115D (not shown in FIG. 1B) of the cooling tube 114B now additionally extend a small amount in the first direction along the second axis $A_2$ to accommodate the movable radiator 112B moving to the second position. The ends 115A-115D also generally extend along the third axis that is perpendicular to both the first axis $A_1$ and the second axis $A_2$ when the movable radiators 112A and 112B are in the first position. Thus, the cooling tubes 114A and 114B can bend as needed to accommodate both the first position and the second position of the movable radiators 112A and 112B.

The cooling tubes 114A and 114B can also stretch as needed to accommodate the physical position of the movable radiators 112A and the 112B. For example, when the movable radiators 112A and 112B move from the first position to the second position, or from the second position to the first position, any of the ends 115A-115D of the cooing tubes 114A and 114B can move from an un-stretched configuration to a stretched configuration. In the stretched configuration, one of the ends 115A-115D will extend a first distance between (i) the fluid tank 106 and (ii) either the movable radiator 112A or the movable radiator 112B. When that same end is in the un-stretched configuration, that end will extend a second distance between (i) the fluid tank 106 and (ii) either the movable radiator 112A or the movable radiator 112B. The second distance is less than the first distance. Thus, the cooling tubes 114A and 114B can stretch as needed to accommodate both the first position and the second position of the movable radiators 112A and 112B.

By using flexible and/or stretchable material for the cooling tubes 114A and the cooling tube 114B, the movable radiators 112A and 112B can be freely moved between the first position and the second position, without disconnecting the movable radiators 112A and 112B from the fluid tank 106. When the movable radiators 112A and 112B move between positions, the ends 115A-115D of the cooling tubes 114A and 114B (or any other portion of the cooling tubes 114A and 114B) can bend, stretch, or both bend and stretch to accommodate the movement of the movable radiators 112A and 112B. While shown in a specific arrangement in FIGS. 1A and 1B, the cooling tubes 114A and 114B may be located in any desired arrangement, relative to the fluid tank 106 and the movable radiators 112A and 112B, and may bend and/or stretch in any manner to accommodate the movement of the movable radiators 112A and 112B.

Figure 1C:
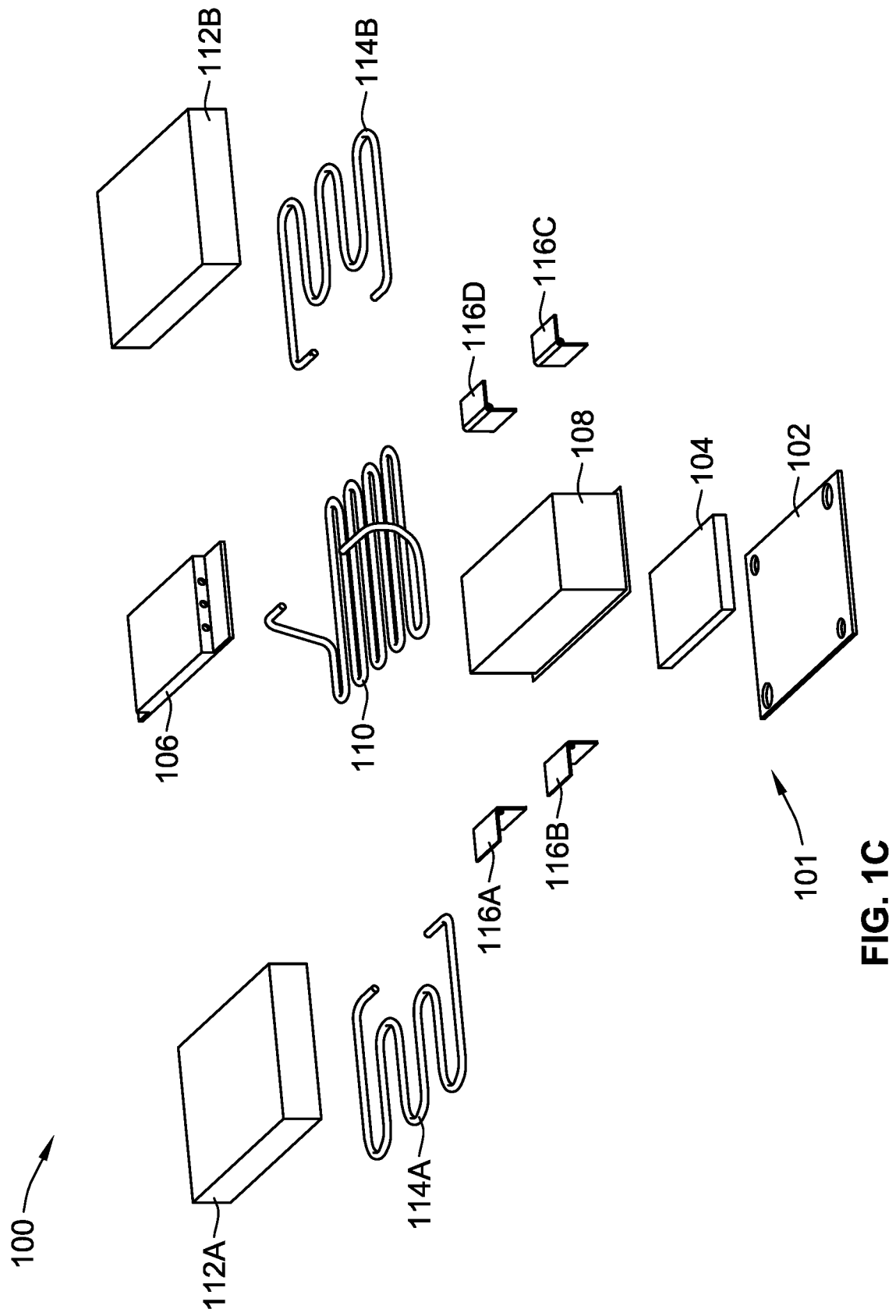
FIG. 1C is an exploded view of the liquid cooling modules of FIG. 1A and FIG. 1B, according to aspects of the present disclosure.

FIG. 1C shows an exploded view of the liquid cooling module 100, including the cold plate 102, the fluid pump 104, the fluid tank 106, the stationary radiator 108, the cooling tube 110, the movable radiator 112A, the movable radiator 112B, the cooling tube 114A, and the cooling tube 114B. FIG. 1C also shows hinges that couple the movable radiators 112A and 112B to the fluid tank 106. The liquid cooling module 100 includes a first pair of hinges 116A and 116B that couple the movable radiator 112A to the fluid tank 106, and a second pair of hinges 116C and 116D that couple the movable radiator 112B to the fluid tank 106. In the illustrated implementation, each of the hinges 116A-116D is generally formed of two plates that are attached to each other and can rotate relative to each other. One plate of each of the hinges 116A-116D is coupled to the fluid tank 106, while the other plate of each of the hinges 116A-116D is coupled to either the movable radiator 112A or the movable radiator 112B. The hinges 116A-116D allow the movable radiators 112A and 112B to rotate relative to the fluid tank 106, between the first position (FIG. 1A) and the second position (FIG. 1B).

While FIG. 1C illustrates a rotating connection between the movable radiators 112A and 112B and the fluid tank 106, other connections are also contemplated. For example, in some implementations, the movable radiators 112A and 112B may be connected to the fluid tank 106 in a manner that allows the movable radiators 112A and 112B to slide between the first position and the second position. In other implementations, the movable radiators 112A and 112B may be connected to the fluid tank 106 in a manner that allows the movable radiators 112A and 112B to both rotate and slide between the first position and the second position. In further implementations, the movable radiators 112A and 112B can be removably coupled to the fluid tank 106. In these implementations, the movable radiators 112A and 112B do not move when coupled to the fluid tank 106. Instead, the movable radiators 112A and 112B can be removed from the fluid tank 106 when in one position, re-oriented to the new position (e.g., the first position or the second position), and then re-coupled to the fluid tank 106.

Figure 2A:
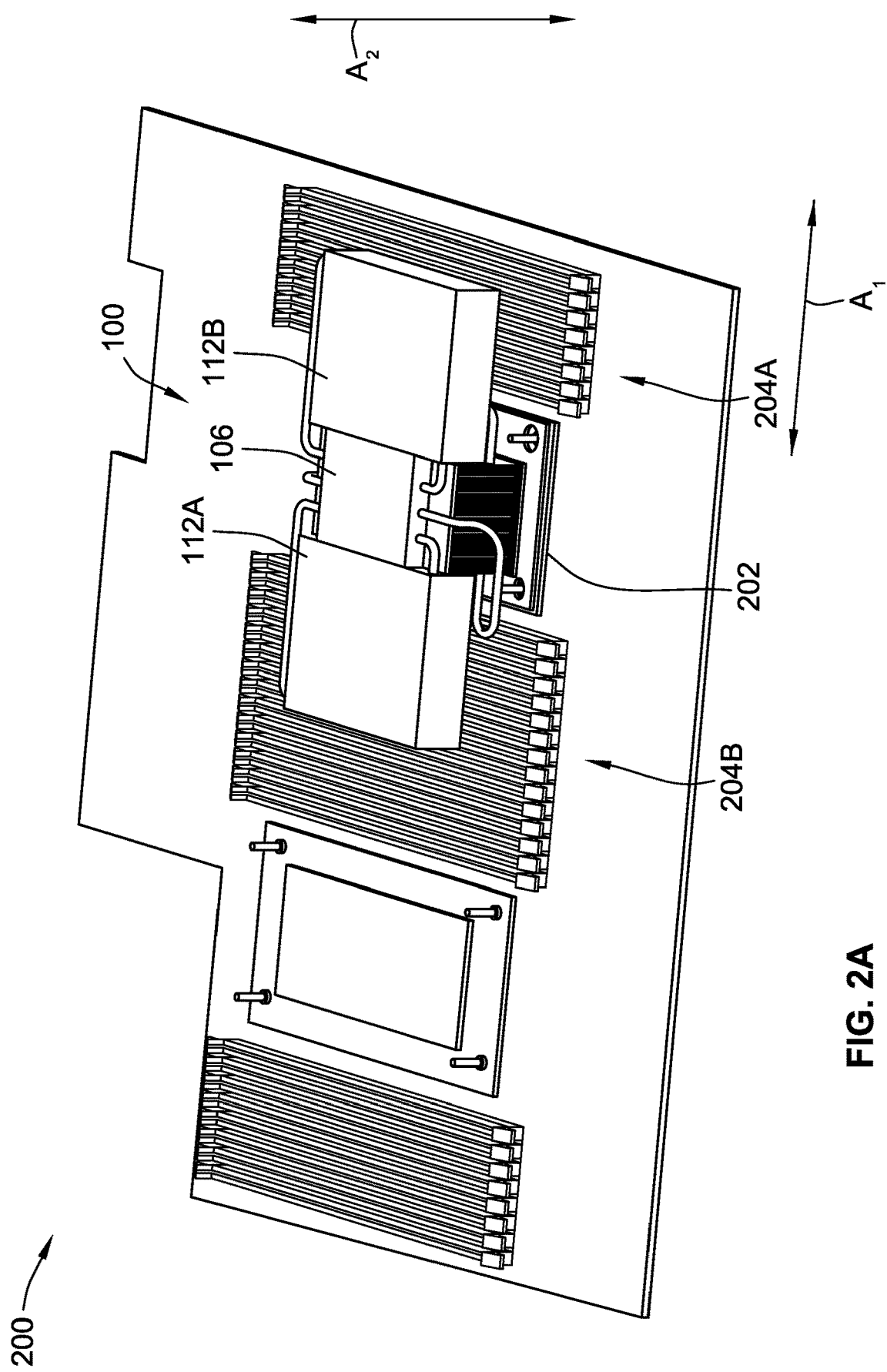
FIG. 2A is a perspective view of the liquid cooling module of FIGS. 1A-1C installed in a computing device and blocking access to electronic components of the computing device, according to aspects of the present disclosure.

FIG. 2A shows a board 200 that can be part of a computing device. The board 200 (which could be a motherboard, a daughterboard, etc.) includes a heat-generating electronic component 202 (which could be a CPU, a GPU, etc.), and memory slots 204A and 204B. The computing device also includes a liquid cooling module 100 installed on top of the heat-generating electronic component 202. In FIG. 2A, the movable radiators 112A and 112B of the liquid cooling module 100 are in the first position, and thus extend away from the fluid tank 106 along the first axis $A_1$. As can be seen in FIG. 2A, when the movable radiators 112A and 112B are in the first position, the movable radiators 112A and 112B are positioned above the memory slots 204A and 204B (e.g., a first axis normal to the board 200 can intersect the movable radiator 112A and the memory slots 204A, and a second axis normal to the board 200 can intersect the movable radiator 112B and the memory slots 204B). If a user wished to install memory modules into the memory slots 204A and/or 204B, the user would be unable to do so, because the movable radiators 112A and 112B block access to the memory slots 204A and 204B.

Figure 2B:
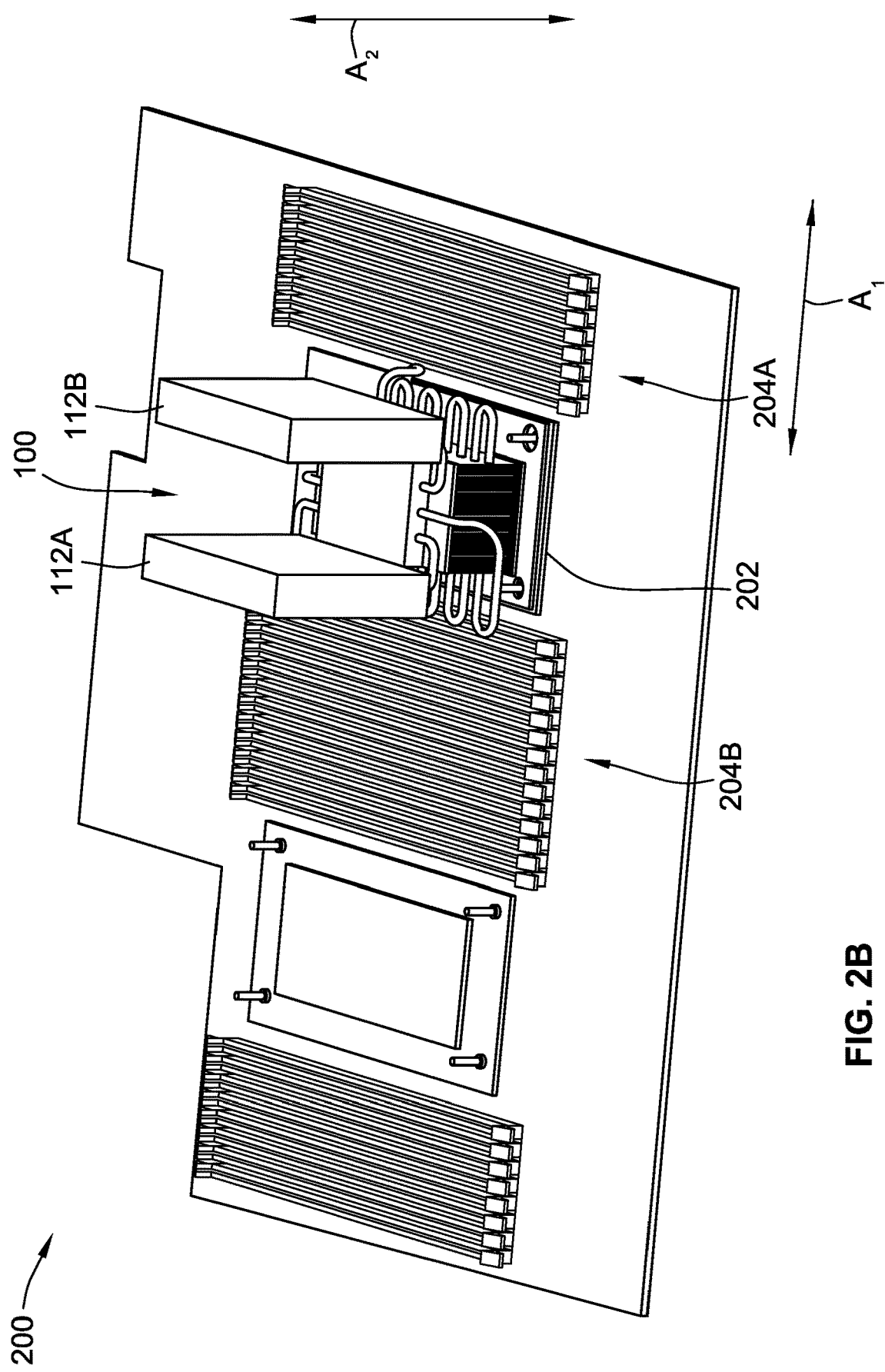
FIG. 2B is a perspective view of the liquid cooling module of FIGS. 1A-1C installed in a computing device and allowing access to electronic components of the computing device, according to aspects of the present disclosure.

FIG. 2B shows the same board 200 as FIG. 2A with the liquid cooling module installed on top of the heat-generating electronic component 202. However, in FIG. 2B, the movable radiators 112A and 112B of the liquid cooling module 100 are in the second position. When in the second position, the movable radiators 112A and 112B extend along the second axis $A_2$, above the fluid tank 106. As can be seen in FIG. 2B, when the movable radiators 112A and 112B are in the second position, the movable radiators 112A and 112B are no longer positioned over the memory slots 204A and 204B (e.g., the axes normal to the board 200 do not intersect the movable radiators 112A and 112B). The movable radiators 112A and 112B allow access to the memory slots 204A and 204B, when the movable radiators 112A and 112B are in the second position, so that the user can install memory modules into the memory slots 204A and 204B, without removing the liquid cooling module 100.

Figure 3:
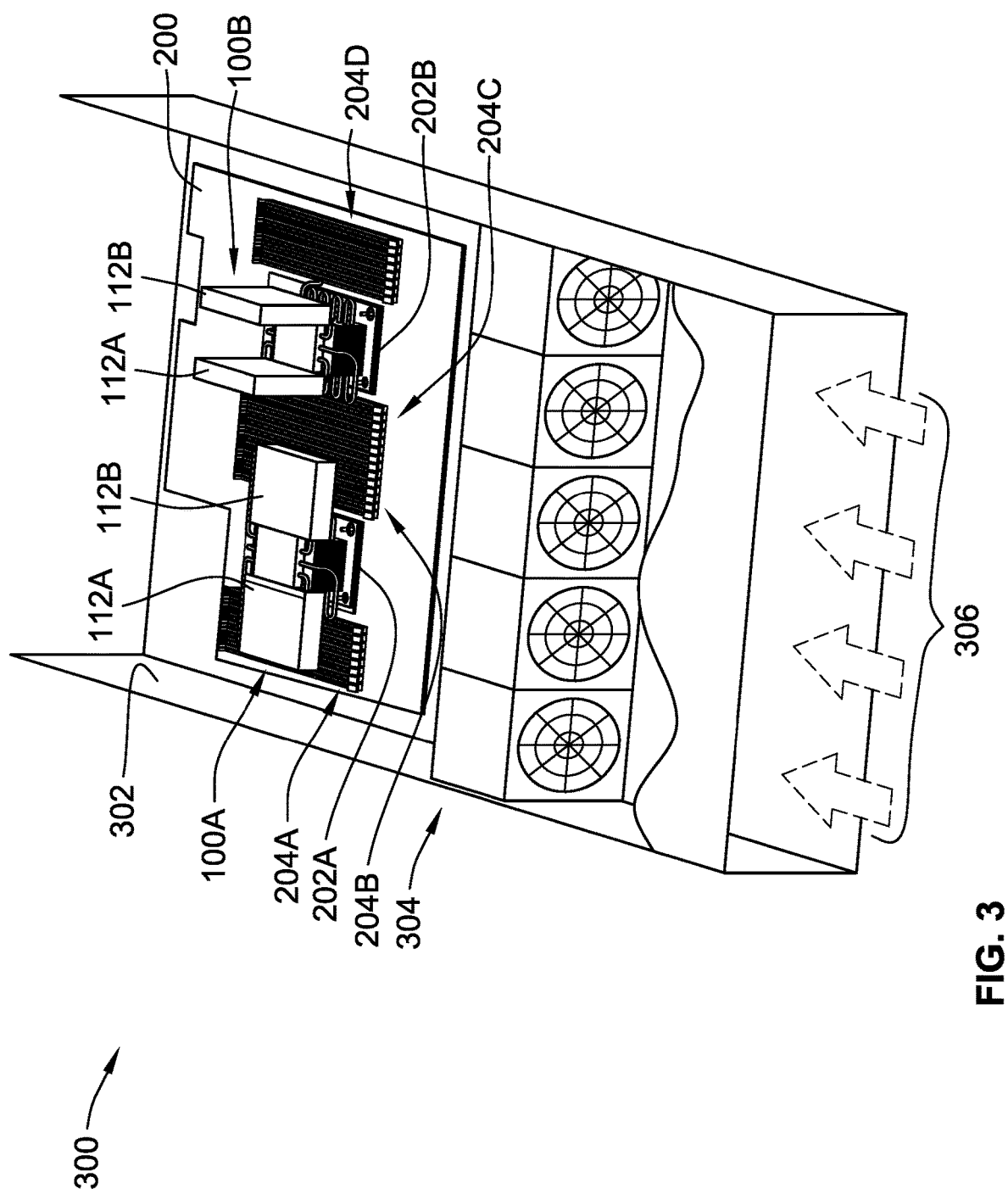
FIG. 3 is a perspective view of the liquid cooling module of FIG. 1A being installed in a computing device, according to aspects of the present disclosure.

FIG. 3 illustrates the liquid cooling modules in a computing device 300. As shown in FIG. 3, the computing device 300 includes a housing 302 in which the board 200 is positioned. Heat-generating electronic components 202A and 202B are disposed on the board 200, along with memory slots 204A, 204B, 204C, and 204D. The board 200 and its components are positioned within the housing 302. The computing device 300 further includes a row of fan modules 304 that are configured to direct air toward the heat-generating electronic components 202A and 202B in the direction indicated by the series of arrows 306. The board 200 includes two separate liquid cooling modules 100A and 100B. Both of the liquid cooling modules 100A and 100B can be similar or identical to the liquid cooling module 100 of FIGS. 1A-1C.

In FIG. 3, the liquid cooling module 100A is fully installed onto the board 200, and is positioned on the heat-generating electronic component 202A. The movable radiators 112A and 112B of the liquid cooling module 100A are in the first position, and thus extend away from the fluid tank 106 to be positioned above the memory slots 204A and 204B. FIG. 3 further shows the liquid cooling module 100B as the liquid cooling module 100B is installed onto the board 200. The movable radiators 112A and 112B of the liquid cooling module 100B are in the second position. As the liquid cooling module 100B is placed onto the heat-generating electronic component 202B, the movable radiators 112A and 112B will not be positioned above the memory slots 204C and 204D. Once the liquid cooling module 100B is fully installed, the movable radiators 112A and 112B of the liquid cooling module 100B can be moved to the first position, so that they are positioned over the memory slots 204C and 204D.

FIG. 3 illustrates the benefit of the movable radiators 112A and 112B. When the movable radiators 112A and 112B are in the first position (e.g., the movable radiators 112A and 112B of the liquid cooling module 100A), the movable radiators 112A and 112B are positioned within the airflow path of the fan modules 304. When the fan modules 304 are operated, a large portion of the surface area of the movable radiators 112A and 112B is exposed to the airflow from the fan modules 304, and heat is removed from the movable radiators 112A and 112B.

When the movable radiators 112A and 112B are in the second position (e.g., the movable radiators 112A and 112B of the liquid cooling module 100B), the movable radiators 112A and 112B will extend above the airflow path of the fan modules 304. If the fan modules 304 are operated when the movable radiators 112A and 112B are in the second position, the air from the fan modules 304 will flow past less of the surface area of the movable radiators 112A and 112B, thereby reducing the effectiveness of the fan modules 304 at removing heat from the movable radiators 112A and 112B. However, the movable radiators 112A and 112B cannot be permanently in the first position, or memory modules in the memory slots 204A-204D would not be able to be serviced or replaced without completely removing the liquid cooling modules 100A and 100B from the housing 302. By using liquid cooling module with movable radiators, a desired amount of heat removal can be achieved, while still allowing access to the memory slots 204A-204D.

While FIGS. 2A, 2B, and 3 illustrate liquid cooling modules being used to prevent or allow access to memory slots and memory modules within a server, the liquid cooling modules described herein can be used in connection with any suitable electronic component within any suitable device. For example, the liquid cooling modules can be used with computing devices that have other components positioned next to the heat-generating electronic components, such as add-on cards, fan modules, power supplies, and the like.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A liquid cooling module for cooling an electronic component, the liquid cooling module comprising:
    a fluid tank configured to hold cooling fluid therein;
    a first movable radiator and a second movable radiator coupled to the fluid tank, the first movable radiator and the second movable radiator each being configured to move between a first position relative to the fluid tank and a second position relative to the fluid tank;

a first cooling tube fluidly coupled to the fluid tank and the first movable radiator to allow the cooling fluid to flow between the fluid tank and the first movable radiator, and a second cooling tube fluidly coupled to the fluid tank and the first movable radiator to allow the cooling fluid to flow between the fluid tank and the first movable radiator; and, wherein when the first movable radiator is in its first position relative to the fluid tank, the first movable radiator extends from the fluid tank in a first direction, wherein when the first movable radiator is in its second position relative to the fluid tank, the first movable radiator extends from the fluid tank in a second direction, the second direction being different than the first direction, and wherein when the second movable radiator is in its first position relative to the fluid tank, the second movable radiator extends in a third direction that is parallel to and opposite of the first direction.

2. The liquid cooling module of claim 1, wherein the first movable radiator and the second movable radiator are each rotatably coupled to the fluid tank, such that the first movable radiator and the second movable radiator are each configured to rotate between their respective first position and their respective second position.

3. The liquid cooling module of claim 2, wherein the first movable radiator and the second movable radiator are each rotatably coupled to the fluid tank via a hinge.

4. The liquid cooling module of claim 1, wherein:
when the first movable radiator is in the first position, at least one of the one or more cooling tubes extends a first distance between the at least one movable radiator and the fluid tank, and
when the first movable radiator is in the second position, the at least one of the one or more cooling tubes extends a second distance between the at least one movable radiator and the fluid tank, the second distance being different than the first distance.

5. The liquid cooling module of claim 1, wherein the first direction and the second direction are perpendicular to each other.

6. The liquid cooling module of claim 5, wherein:
when the first movable radiator is in the first position, at least one of the one or more cooling tubes extends in the first direction between the first movable radiator and the fluid tank, and
when the first movable radiator is in the second position, the at least one of the one or more cooling tubes extends in the first direction and the second direction between the first movable radiator and the fluid tank.

7. The liquid cooling module of claim 1, wherein when the first movable radiator and the second movable radiator are in the second position, the first movable radiator and the second movable radiator extend in the second direction, the second direction being perpendicular to both the first direction and the third direction.

8. The liquid cooling module of claim 1, wherein the one or more cooling tubes includes a first cooling tube fluidly coupled to the fluid tank and the first movable radiator, and a second cooling tube fluidly coupled to the fluid tank and the second movable radiator.

9. The liquid cooling module of claim 1, further comprising:
a stationary radiator coupled to the fluid tank; and
a cold plate assembly coupled to the stationary radiator, the cold plate assembly configured to contact a heat-generating electronic component, the cold plate assembly being positioned between the heat-generating electronic component and the stationary radiator when the cold plate assembly contacts the heat-generating electronic component, the stationary radiator being positioned between the cold plate assembly and the fluid tank.

10. The liquid cooling module of claim 9, wherein the cold plate assembly includes a cold plate and a fluid pump, the cold plate being configured to contact the heat-generating electronic component.

11. The liquid cooling module of claim 10, wherein
the stationary radiator is in fluid communication with the fluid tank.

12. The liquid cooling module of claim 11, wherein the fluid pump, the stationary radiator, the fluid tank, and the first movable radiator form a first fluid loop, wherein the fluid pump, the stationary radiator, the fluid tank, and the second movable radiator form a second fluid loop, and wherein the fluid pump is configured to cause fluid to flow around the first fluid loop and around the second fluid loop.

13. The liquid cooling module of claim 12, wherein cooling fluid near the fluid pump is configured to be heated by the heat-generating electronic component, and wherein the fluid pump is configured to cause the heated cooling fluid to flow from the cold plate assembly and through the stationary radiator and the at least one movable radiator.

14. The liquid cooling module of claim 12, wherein the heated cooling fluid is configured to cool when flowing through the stationary radiator, the first movable radiator, and the second movable radiator, and wherein the fluid pump is configured to cause the cooled cooling fluid to flow from the stationary radiator, first movable radiator, and the second movable radiator, to the cold plate assembly.

15. The liquid cooling module of claim 9 in combination with a computing device including:
a housing;
a heat-generating electronic component positioned inside the housing; and
at least one additional electronic component positioned inside the housing,
wherein the liquid cooling module is configured to be positioned inside the housing such that the cold plate assembly contacts the heat-generating electronic component.

16. The liquid cooling module of claim 15, wherein:
when the first movable radiator is in the first position, the first movable radiator blocks access to the at least one additional electronic component within the housing; and
when the first movable radiator is in the second position, the first movable radiator allows access to the at least one additional electronic component within the housing.

17. A computing device comprising:
a housing;
a heat-generating electronic component positioned inside the housing;
a first additional electronic component and a second additional electronic component positioned inside the housing; and
a liquid cooling module positioned inside the housing and configured to cool the heat-generating electronic component, the liquid cooling module including:
a fluid tank configured to hold cooling fluid therein;
a first movable radiator and a second movable radiator coupled to the fluid tank, first movable radiator and the second movable radiator each being configured to move between a first position relative to the fluid tank and a second position relative to the fluid tank;

a first cooling tube coupled to the fluid tank and the first movable radiator to allow the cooling fluid to flow between the fluid tank and the first movable radiator; and a second cooling tube fluidly coupled to the fluid tank and the first movable radiator to allow the cooling fluid to flow between the fluid tank and the first movable radiator; and, wherein when the first movable radiator is in its first position relative to the fluid tank, the first movable radiator extends from the fluid tank in a first direction and blocks access to the first additional electronic component within the housing, wherein when the first movable radiator is in its second position relative to the fluid tank, the first movable radiator extends from the fluid tank in a second direction that is different than the first direction, allows access to the first additional electronic component within the housing, and wherein when the second movable radiator is in its first position relative to the fluid tank, the second movable radiator extends in a third direction that is parallel to and opposite of the first direction, and blocks access to the second additional electronic component within the housing.

18. A liquid cooling module for cooling an electronic component, the liquid cooling module comprising:

a cold plate configured to contact the electronic component;

a stationary radiator positioned on the cold plate such that the cold plate is positioned between the electronic component and the stationary radiator when the cold plate contacts the electronic component;

a fluid tank positioned on an opposite side of the stationary radiator such that the stationary radiator is positioned between the cold plate and the fluid tank;

a cooling tube fluidly coupled to the fluid tank and the stationary radiator to allow the cooling fluid to flow between the fluid tank and the stationary radiator;

at least one movable radiator physically coupled to the fluid tank and configured to move between a first position relative to the fluid tank and a second position relative to the fluid tank; and one or more additional cooling tubes, each fluidly coupled to the fluid tank and one of the at least movable radiators to allow the cooling fluid to flow between the fluid tank and the at least one movable radiator, wherein when the at least one movable radiator is in the first position relative to the fluid tank, the at least one movable radiator extends from the fluid tank in a first direction, and wherein when the at least one movable radiator is in the second position relative to the fluid tank, the at least one movable radiator extends from the fluid tank in a second direction, the second direction being different than the first direction.

* * * * *